United States Patent

Yunoki et al.

Patent Number: 5,236,372
Date of Patent: Aug. 17, 1993

[54] NO-INSERTION FORCE CONNECTOR ASSEMBLY

[75] Inventors: Shuichi Yunoki; Kenjiro Katabuchi; Tetsuya Kobayashi; Yumiko Suzuki, all of Tokyo, Japan

[73] Assignee: NEC Corporation, Japan

[21] Appl. No.: 837,720

[22] Filed: Feb. 19, 1992

[30] Foreign Application Priority Data

Feb. 20, 1991 [JP] Japan ............................. 3-045667
Jul. 19, 1991 [JP] Japan ............................. 3-178585

[51] Int. Cl.⁵ ............................................ H01R 13/15
[52] U.S. Cl. ................................. 439/260; 439/59; 439/60
[58] Field of Search .................... 439/59, 60, 259, 260, 439/262, 263, 265, 266, 267, 269, 374, 377, 381, 629, 637, 660

[56] References Cited

U.S. PATENT DOCUMENTS

| | | | |
|---|---|---|---|
| 3,744,005 | 7/1973 | Sitzler | 439/260 |
| 4,298,237 | 11/1981 | Griffith et al. | 439/60 |
| 4,598,966 | 7/1986 | Boland | 439/260 |
| 4,684,194 | 8/1987 | Jenkins et al. | 439/260 |
| 4,806,103 | 2/1989 | Kniese et al. | 439/60 |
| 5,041,023 | 8/1991 | Lytle | 439/637 |

*Primary Examiner*—Larry I. Schwartz
*Assistant Examiner*—Khiem Nguyen
*Attorney, Agent, or Firm*—Ostrolenk, Faber, Gerb & Soffen

[57] ABSTRACT

In a no-insertion force connector assembly comprising a connector body comprising a housing for supporting a plurality of resiliently deformable contact members, a connector portion provided on a print circuit board, the connector portion having a plurality of contact terminals each positioned at a place corresponding to the contact of the contact member and at least one float member for resiliently deforming the contact members so that their contacts may each shift to a position where they are each electrically connected to the corresponding contact terminal, the contact members each comprises a plurality of first and second contact members, which are each different in the length ranging from the connecting end up to the above-described contact, the first and second contact members being alternately disposed. The float member comprises a first engaging means for first coming in contact with the first contact member for resilient deformation while shifting and a second engaging means for subsequently resiliently deforming the second contact member. Since the deformation of the first and second contact members by the float mechanism is carried out at different times, an operational force required to shift the float member can be remarkably small thus easing its operation.

5 Claims, 3 Drawing Sheets

NO-INSERTION FORCE CONNECTOR ASSEMBLY

FIELD OF THE INVENTION

The present invention relates to a connector assembly comprising a connector portion provided at a print circuit board used in an electronic apparatus such as a communication apparatus or the like and a connector body coupled to this connector portion, and more specifically to a connector assembly of a type generally referred to as a no-insertion force connector assembly, which calls for substantially no insertion force when the connector portion of the print circuit board is inserted into the connector body.

BACKGROUND OF THE INVENTION

Conventionally, a connector body for this kind of noinsertion force connector assembly generally has a thin and elongated slit on the front surface of a housing which extends in its longitudinal direction so that the connector portion of the print circuit board may be inserted within this slit. Arrayed along at least One Of surfaces Of the slit is a plurality of contact members each corresponding to a plurality of contact terminals provided at the connector portion of the print circuit board. Each contact member is comprised of a connecting terminal at its one end for being connected to the external circuit and a resilient member having a contact at its other end. It is retained at a retracted position where its contact is not in contact with the contact terminal of the print circuit board until the connector body and the connector portion of the print circuit board are placed in a predetermined coupling position. Therefore, the insertion force is not practically necessary or is not necessary at all when the print circuit board is inserted. After the connector body and the print circuit board connector portion are placed at the predetermined coupling position, each contact member is resiliently deformed so that its contact advances up to a position where it comes in contact with its corresponding contact terminal, and is retained at this position to thereby achieve a desired electrical connection.

A means for resiliently deforming each contact member so that its contact advances up to the position where it comes in contact with the corresponding contact terminal comprises a float member slidably provided on the housing of the connector body and a bar member for resiliently deforming each contact member by shifting the float member toward a front aperture portion of the slit so that its contact comes in contact with the contact terminal of the print circuit board.

In the conventional no-insertion force connector assembly, after the connector portion is inserted into the slit of the connector body, a bar is inserted from a bar insertion hole of the connector body to force the float up to resiliently deform the contact member so that a desired electrical contact may be achieved. In that process, each contact member, which has the same total length, simultaneously comes in contact with the contact terminal of the connector portion of the print circuit board when the contact members are resiliently deformed by the same amount. That is, since all the contact members are necessary to be simultaneously deformed, a high insertion force is needed when the bar is inserted.

In addition, in the conventional no-insertion force connector assembly, the total lengths and the electrical contact positions of all the contact members are equal as measured in their longitudinal direction, and the positions of the contact terminals of the print circuit board connector portion are the same over the entire array. In consequence, the contact terminal at the connector portion of the print circuit board cannot be set in its width to below a certain limit in view of the reliability of the electrical connection between it and the contact member. This poses a certain constraint in reducing the distance between the adjacent contacts, that is, the pitch.

Accordingly, an object of the present invention is to provide a no-insertion force connector assembly which allows the insertion force to be reduced as the bar is inserted.

Another object of the present invention is to provide a no-insertion force connector assembly which allows the distance between the adjacent contacts, that is, the pitch to be made small as compared with the conventional one.

SUMMARY OF THE INVENTION

According to the present invention, there is provided a no-insertion force connector assembly comprising a connector body comprising a housing for supporting a plurality of resiliently deformable contact members each having an end connected to the external circuit at its proximal end portion and a contact at its tip end portion, a connector portion provided on a print circuit board, the connector portion having a plurality of contact terminals each placed at a place corresponding to the contact of the contact member when placed in a predetermined relationship to the connector body and at least one float member for resiliently deforming the contact members so that, when they are shifted from a first to second position, the contacts each shift to a position where they are each electrically connected to the corresponding contact terminal of the connector portion placed in a predetermined relationship to this connector body, characterized in that the contact member comprises a plurality of first and second contact members each different in their length ranging from the connecting end up to the contact, and the first and second contact members being alternately disposed, the float member comprises a first engaging means for first coming in contact with the first contact member while shifting from the first position up to the second position to resiliently deform the first contact member so that its contact may shift to a position where it comes in contact with the corresponding contact terminal and a second engaging means for subsequently coming in contact with the second contact member to resiliently deform the second contact member so that its contact may shift to a position where it comes in contact with the corresponding contact terminal.

That is, in the no-insertion force connector assembly according to the present invention, two set of contact members each different in length are used and, while these contact members are resiliently deformed by movement of the float member so that the contact come in contact with the corresponding contact member, the first contact member, which is short in total length, is deformed and, subsequently, the second contact member, which is long in total length, is deformed so that the time when each of the contact members is deformed by the float mechanism can be desynchronized. As a result, as compared with a case in which all the contact members are simultaneously deformed, an operational force required to shift the float member can be remarkably small, not only easing its operation, but also allowing a reliable electrical connection.

In the no-insertion force connector assembly according to the present invention, the connector portion of the print circuit board preferably has an insulating layer provided so as to cover the surface of the print circuit board except for notch portions which expose the contact terminal, each notch portion having two lateral walls opposed to each other, which each extend parallel to the longitudinal direction in which the contact member runs, the lateral walls each having an inclined or a curved guide surface so that both of them come close to each other as they approach the surface of the contact terminal. Even if the contact member is placed above the guide surface, the latter acts to guide the contact of the contact member to the surface of the contact terminal when the contact member undergoes a predetermined elastic deformation by the above-described action.

Other features and advantages inherent to the present invention will be better understood from the accompanying drawings when read in conjunction with the following detailed description.

DETAILED DESCRIPTION OF THE PREFERRED EMBODIMENTS

Figure 1:
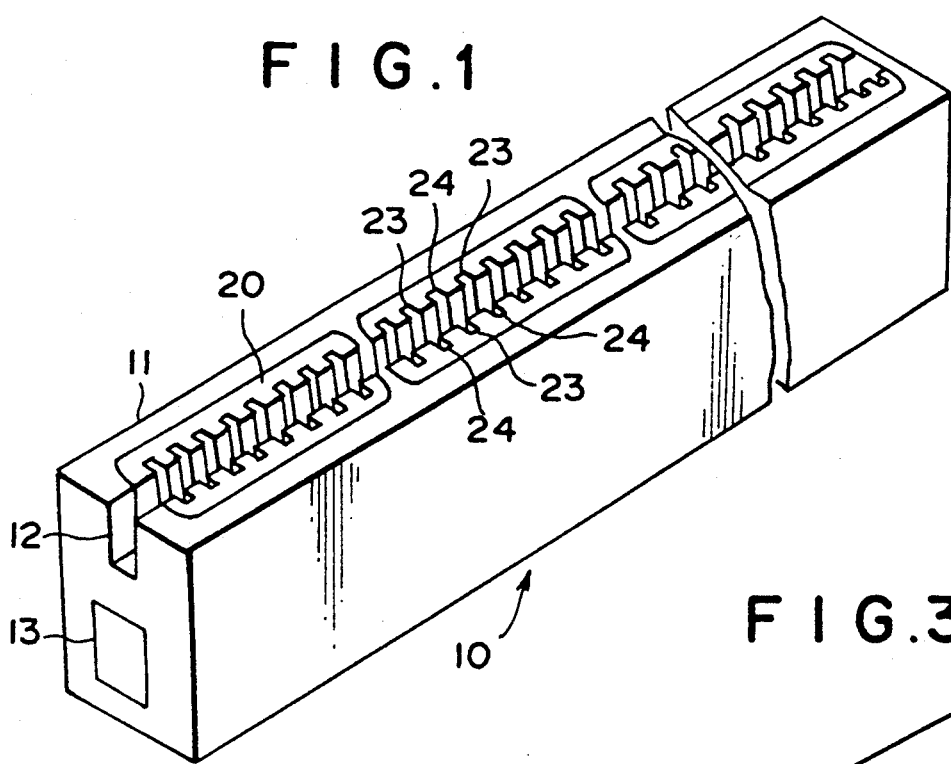
FIG. 1 is a partial perspective view illustrating a connector body of the no-insertion force connector assembly according to a specific embodiment of the present invention.
Figure 2:
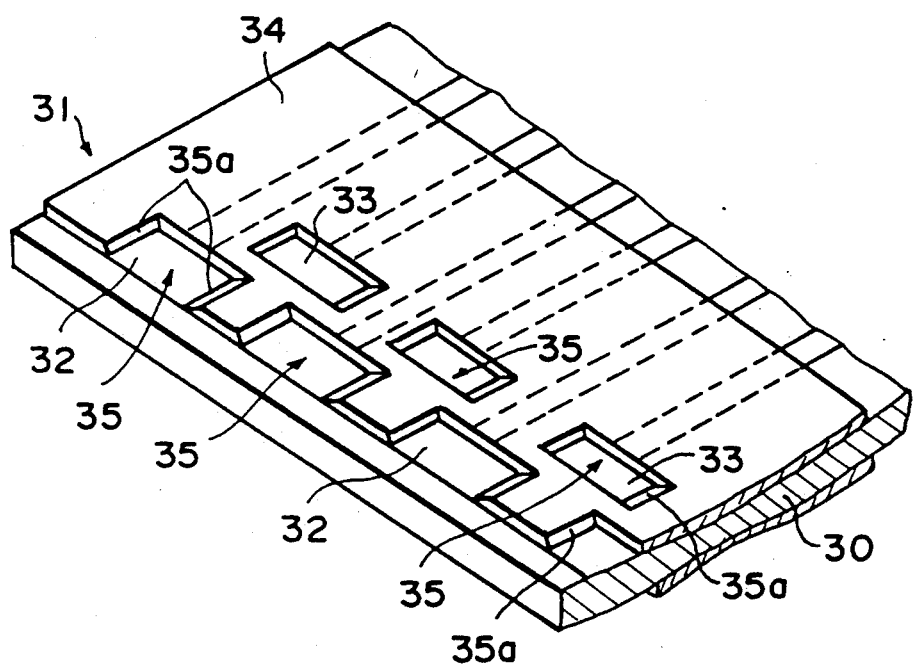
FIG. 2 is a partial perspective view illustrating a print circuit board to be connected to the connector body of FIG. 1.

Referring to FIG. 1, reference numeral 10 denotes a connector body, which constitutes a no-insertion force connector assembly according to the present invention together with a connector portion 31 provided on a print circuit board 30 illustrated in FIG. 2.

Figure 3:
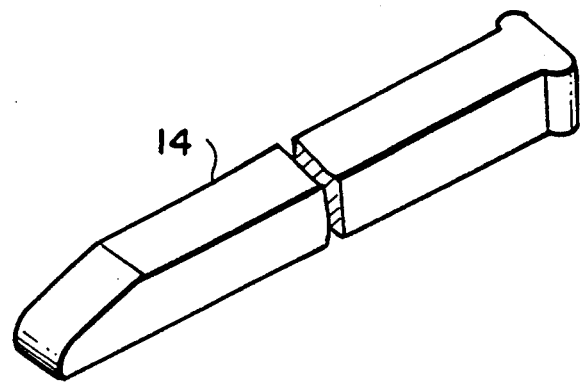
FIG. 3 is a perspective view illustrating a bar to be mounted to the connector body of FIG. 1.

The connector body 10 has an elongated housing 11 having a substantially rectangular cross-section, within which a float 20, which will be described later, is movably accommodated within a predetermined range relative to the housing. In addition, a slit 12 into which the connector portion is to be inserted is formed on one surface of the housing so as to extend in its longitudinal direction. Reference numeral 13 denotes a hole for inserting a bar 14 (shown in FIG. 3), which shifts the float 20 from one end of its shift range toward its other end where the float is retained.

Figure 4:
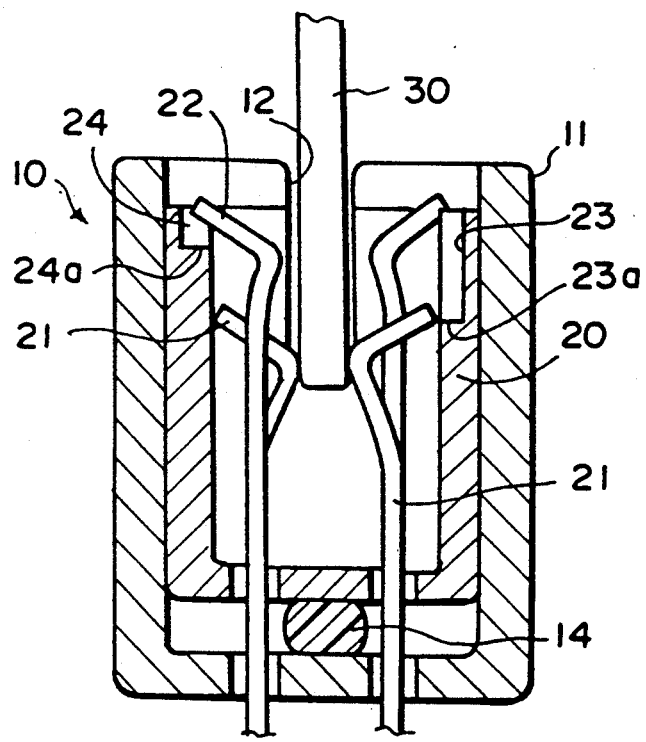
FIG. 4 is a cross-sectional view illustrating a state in which, while the connector body of FIG. 1 and the print circuit board of FIG. 2 are coupled in a predetermined relationship, some of the contact members lie in a predetermined contact position.

As illustrated in FIG. 4 in greater detail, the connector body 10 presents the form of a channel having a substantially U-shaped cross-section, within which the channeled float 20 also having the substantially U-shaped cross-section is accommodated so as to shift in a predetermined range in the direction approaching or departing from the bottom surface of the connector body, that is, in the vertical direction of FIG. 4, and is preferably biased in the direction departing from the bottom surface of the connector body by means of a spring means (not shown). Within this float 20, two sets of resilient contact members which each comprise a plurality of first short contact members 21 and a plurality of second elongated contact members 22 are accommodated so that they are opposed to each other with the slit interleaved therebetween. The contact members 21 and 22 each pass through the bottom wall of the connector body 10, and are supported against the housing at a predetermined position A connecting terminal for being connected to the external circuit is formed at their one end, that is, the outer end, while a contact is formed at the other end so as to come in contact with the corresponding terminal of the connector portion 31 of the print circuit board 30 within the float 20. As can be seen from FIG. 4, the position of the contact of each contact member 22 is set at the position spaced apart from the bottom surface of the connector body 11 by a predetermined distance relative to the position of the contact of each contact member 21.

More specifically, each contact member has a substantially V-shaped portion at its free end portion, the bottom surface of which forms a contact which contacts the contact terminal of the connector portion 31 of the print circuit board 30. In addition, the tip end of the short contact member 21 protrudes into a first channel 23 on the float 20, which extends parallel to the traveling direction of the float 20, and the tip end of the elongated contact member 22 protrudes into a similar second channel 24. In this embodiment, the first set of short contact members 21 and the first set of elongated contact members 22 are each disposed so as to be opposed to the second set of elongated contact members 22 and the second set of short contact members 21 respectively. However, the first set of short contact members 21 and the first set of elongated contact members 22 may be each disposed so as to be opposed to the second set of short contact members 21 and the second set of elongated contact members 22 respectively. FIG. 4 illustrates a cross-section of its left side taken at the elongated contact member 22 and a cross-section of its right side taken at the position of the short contact member 21 with the center line indicated by a dashed line interleaved therebetween.

Further, at the float 20, an urging means is provided within this first channel 23 so as to make the contact of each contact member close to the connector portion 31 of the print circuit board 30 while the float 20 shifts from its retracted position, where it lies close to the bottom surface of the connector body, to its farthest advanced position. To be concrete, this urging means comprises a first engaging surface 23a provided within the first channel 23 so as to engage the tip end portion of the short contact member 21 and a second engaging surface 24a provided within the second channel 24 so as to engage the tip end portion of the elongated contact member 22.

Therefore, when the float 20 moves between its retracted position which is close to the bottom surface of the connector body and its furthest advanced position, the free end of each contact member is driven in the direction approaching or departing from the connector portion 31 of the print circuit board 30.

On the other hand, as shown in FIG. 2, the connector portion 31 of the print circuit board 30 comprises first contact terminals 32, 32 disposed in a row along a straight line and second contact terminals 33, 33 disposed along a straight line running parallel to the straight line along which the first contact terminals are disposed in a row. The positions of the first and second contact terminals 32, 33 are selected so that, when the connector portion 31 is brought to a predetermined position relative to the connector body 10, they may each come in contact with the short contact member 21 and the elongated contact member 22. Preferably, an insulating layer 34 is provided on this connector portion 31 so as to cover its surface, the insulating layer 34 providing notches 35 so as to expose the surface of each contact terminals 32, 33 to the outside.

FIG. 4 illustrates a state in which the float 20 is slightly forced up by the bar 14, in which state the short contact member 21 is retained at its contact position with the contact terminal 32 by engagement with the first engaging surface 23a while the elongated contact member 22 is not coming in contact with the contact terminal 33 yet.

Figure 5:
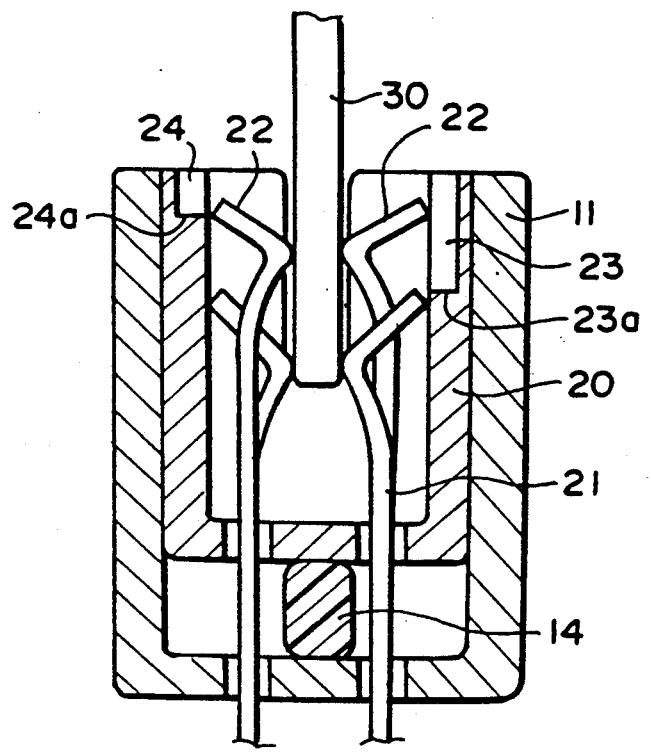
FIG. 5 is a cross-sectional view illustrating a state in which the connector body of FIG. 1 and the print circuit board of FIG. 2 are coupled in a predetermined relationship and all the contact members lie in predetermined contact positions.

If, from this state, the float 20 is shifted toward the second position illustrated in FIG. 5 by further insertion of the bar 14, in that process, the second engaging portion 24a of the float engages the elongated contact member 22 so that the member 22 is coming in contact with its corresponding second contact terminal 33. The contact of the short contact member 21 with the first contact terminal 32 and the contact of the elongated contact member 22 with the second contact terminal 33 are accomplished in a state in which the float 20 is placed at its second position, and this state will remain unchanged as long as the bar 14 is not removed.

What matters is that, while the float 20 is shifted from its first position toward its second position, the short contact member 21 is first elastically deformed, and then the elongated contact member 22 is elastically deformed. As a result, a force required to move the float 20 may be small, and the movement of the float can be smoothly achieved as compared with a case all the contact members are simultaneously elastically deformed.

Further, since the alternate positioning of the contact members 21 and 22 of different kinds allows the two kinds of corresponding contact terminals to be disposed at a small interval in the direction vertical to that in which the print circuit board is inserted into the connector body, it becomes possible to make the size of the connector assembly small.

Referring again to FIG. 2, the insulating layer 34 provided on the contact terminal 31 of the print circuit board 30 has notches 35 each corresponding to each contact terminal, and two lateral walls 35a, which extend parallel to the direction in which the print circuit board 30 is inserted into the connector body 10, each preferably forms a surface inclined at a predetermined angle in the direction in which they come close to the surface of the contact terminal, for example, at an angle of about 45 degrees. Even if the contact member is placed above this inclined surface, the surface acts to guide the contact toward the surface of the contact terminal when the contact member undergoes a predetermined elastic deformation by the above-described action.

Although placement of the contact member above the inclined lateral wall 35a cannot happen when each contact member is mounted at a predetermined position of the connector body, it can happen when the contact member is deformed for some reason, or the mounting accuracy of the contact member is not good. Although, in order to avoid a misalignment of the contact member, it is required to produce the connector body or print circuit board according to some special process or under the strict control of processing accuracy, it is difficult to realize such a high accuracy in view of the constraint posed on the manufacturing cost.

Even if such a misalignment takes place for the tip end portions of the contact member, since the inclined lateral wall 35a absorbs this misalignment, a reliable electrical contact can always be achieved.

Figure 6:
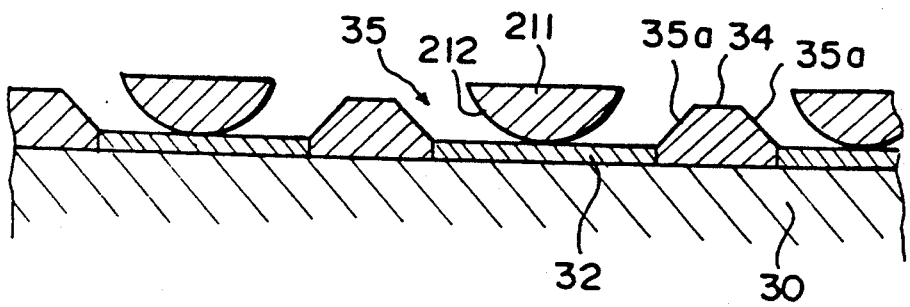
FIG. 6 is a partial cross-sectional view illustrating a no-insertion force connector assembly according to another embodiment of the present invention.

FIG. 6 illustrates part of the connector assembly according to another embodiment of the present invention. For the convenience of description, the figure illustrates only the contact terminal 32 provided on either one surface of the print circuit board and part of the corresponding short contact member. In this embodiment, the insulating layer 34 provided on the print circuit board 30 has notches 35 similar to those of FIG. 2. In addition, a short contact member 211 forms a curved surface 212 forming part of a cylinder on the lateral surface opposed to the corresponding contact terminal 32. Incidentally, although not shown, the elongated contact member corresponding to the second contact terminal can also takes a similar shape. According to this embodiment, even if, as described above, the contact member happen to be placed above the inclined lateral wall 35a, the contact member may be reliably guided to a predetermined contact position by the sliding effect between the inclined surface 35a and the curved surface 212.

Figure 7:
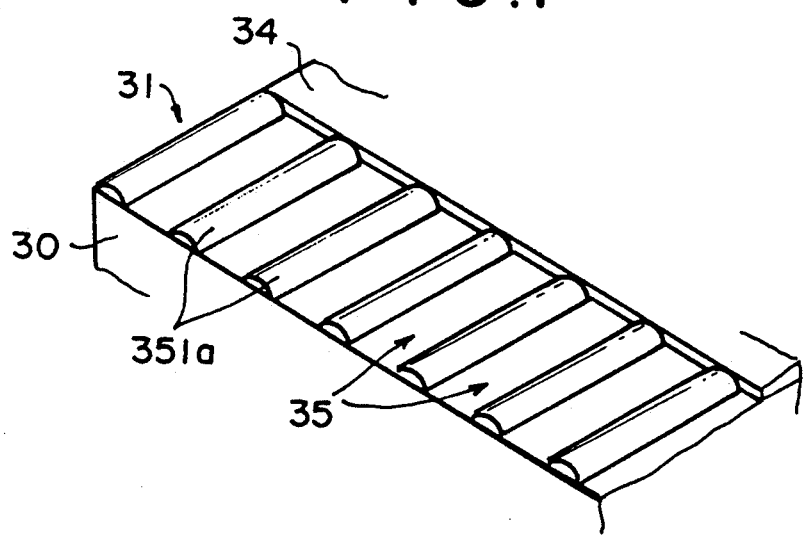
FIG. 7 is a partial cross-sectional view illustrating part of a print circuit board of the no-insertion force connector assembly according to another embodiment of the present invention.
Figure 8:
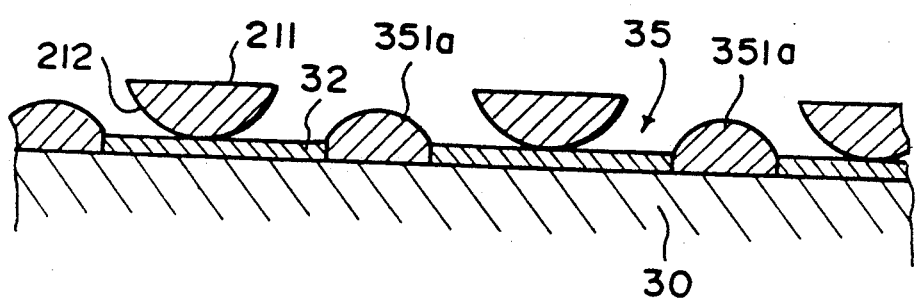
FIG. 8 is a partial cross-sectional view illustrating a state in which the connector body is in contact with the print circuit board of FIG. 7.

Otherwise, as shown in FIGS. 7 and 8, the insulating layer 34 may has a rib 351a forming part of a cylinder at its portion lying between the adjacent notches 35, 35 so that the rib 351a extends parallel to the longitudinal direction in which the contact member runs. Even in this case, the misalignment of the contact members can be absorbed by the sliding effect between the curved surface 212 of the contact member and the curved surface of the rib 351a.

As described above, in the connector assembly according to the present invention, since two kinds of members different in their total length (short and elongated) are alternately disposed as the plurality of contact members for being electrically connected to the contact terminal of the print circuit board, the operational force required to shift the float mechanism for resiliently deforming the contact members can be greatly reduced.

In addition, since the plurality of contact members for being electrically connected to the contact terminals of the print circuit board is alternately disposed so that the short and elongated ones may be alternately disposed, the electrical contact position is also alternately offset in the longitudinal direction of the contact member according to the total length of the contact member and the contact terminal of the print circuit board is also alternately offset according to the electrical contact position, the width of the contact terminal portion can be narrowed except for the portion of the same which contacts the electrical contact of the contact member, which makes it possible to reduce the pitch at which the contact members are arrayed, as compared with the conventional ones.

What is claimed is:

1. No-insertion force connector assembly which comprises a connector body having a housing for supporting a plurality of resiliently deformable contact members each having a proximal end portion connected to an external circuit and a contact at its tip end portion, a connector portion provided on a circuit board and having a plurality of contact terminals places at positions each corresponding to the contact of the contact member when the circuit board is being placed in a predetermined relationship to the connector body and at least one float member for resiliently deforming the contact members so that, when said float member is shifted from a first to a second position, each of said contacts may be shifted to a position, where it may be electrically connected to the corresponding contact terminal of the connector portion disposed in the predetermined relationship to the connector body, characterized in that said contact members each comprise a plurality of first and second contact members each different in the length ranging from said proximal end up to said contact, said first contact members and said second contact members being alternately disposed, and said float member comprises a first engaging means for first coming into contact with said first contact member while shifting from said first position up to said second position, to thereby resiliently deform said first contact member so as to shift its contact to a position where it comes in contact with the corresponding contact terminal, and a second engaging means for subsequently coming in contact with said second contact member to thereby resiliently deform said second contact member so as to shift its contact to a position where it comes in contact with the corresponding contact terminal, said connector portion provided on said circuit board having an insulating layer provided so as to cover the surface of said print circuit board except for notch portions which expose said contact terminals, said notch portions of said insulating layer each having first and second walls opposed to each other, which extend parallel to the longitudinal direction of said contact member, said walls each forming a surface inclined at a predetermined angle so that, as the inclined surfaces come close to the surface of said contact terminal that is exposed by said notch portion, said inclined surfaces approach each other.

2. No-insertion force connector assembly as set forth in claim 1 wherein said float member has channels for accommodating the tip end portion of each of said first and second contact members, said channels each having a channel extending parallel to the direction in which said float member travels.

3. No-insertion force connector assembly as set forth in claim 2 wherein said first and second engaging means of said float member each comprise an engaging surface formed on said channel.

4. No-insertion force connector assembly as set forth in claim 1 wherein said first and second contact members each form a curved surface at its side opposed to said contact terminal of said connector portion so as to form part of a cylindrical body having an axis extending parallel to its longitudinal direction.

5. No-insertion force connector assembly which comprises a connector body having a housing for supporting a plurality of resiliently deformable contact members each having a proximal end portion connected to an external circuit and a contact at its tip end portion, a connector portion provided on a circuit board and having a plurality of contact terminals places at positions each corresponding to the contact of the contact member when the circuit board is being placed in a predetermined relationship to the connector body and at least one float member for resiliently deforming the contact members so that, when said float member is shifted from a first to a second position, each of said contacts may be shifted to a position, where it may be electrically connected to the corresponding contact terminal of the connector portion disposed in the predetermined relationship to the connector body, characterized in that said contact members each comprise a plurality of first and second contact members each different in the length ranging from said proximal end up to said contact, said first contact members and said second contact members being alternately disposed, and said float member comprises a first engaging means for first coming in contact with said first contact member while shifting from said first position up to said second position, to thereby resiliently deform said first contact member so as to shift its contact to a position where it comes in contact with the corresponding contact terminal, and a second engaging means for subsequently coming in contact with said second contact member to thereby resiliently deform said second contact member so as to shift its contact to a position where it comes in contact with the corresponding contact terminal, said connector portion provided on said circuit board having an insulating layer provided so as to cover the surface of said print circuit board except for notch portions which expose said contact terminals, said notch portions of said insulating layer each having first and second walls opposed to each other, which extend parallel to the longitudinal direction of said contact member, said walls each forming a surface curved so as to approach each other as they come close to the surface of said contact terminal that is exposed by said notch portion.

* * * * *